United States Patent [19]

Kitamura

[11] Patent Number: 5,657,338

[45] Date of Patent: Aug. 12, 1997

[54] TAPERED THICKNESS WAVEGUIDE INTEGRATED SEMICONDUCTOR LASER

[75] Inventor: Mitsuhiro Kitamura, Tokyo, Japan

[73] Assignee: NEC Corporation, Tokyo, Japan

[21] Appl. No.: 548,912

[22] Filed: Oct. 26, 1995

[30] Foreign Application Priority Data

Oct. 27, 1994 [JP] Japan .................................. 6-263760

[51] Int. Cl.$^6$ .............................. H01S 3/19; G02B 6/26; G02B 6/10
[52] U.S. Cl. .............................. 372/50; 372/46; 385/43; 385/131
[58] Field of Search .............................. 372/50, 45, 46; 385/43, 129, 130, 131

[56] References Cited

PUBLICATIONS

Kasaya et al., "Monolithically Integrated DBR Lasers with Simple Tapered Waveguide for Low–Loss Fibre Coupling", Electronics Letters, vol. 29, No. 23, pp. 2067–2068 Nov. 1993.

Moerman et al., "Monolithic Integration of a Spot Size Transformer With a Planar Buried Heterostructure In GaAsP/InP–Laser Using the Shadow Masked Growth Technique", IEEE Photonics Technology Letters, vol. 6, No. 8, pp. 888–890 Aug. 1994.

Tohmori et al., "Spot-size Converted 1.3um laser with Butt–Jointed Selectively Grown Vertically Tapered Waveguide", Electronics Letters, vol. 31, No. 13, pp. 1069–1070 Jun. 1995.

"Tapered Thickness MQW Waveguide BH MQW Lasers", The Institute of Electronics Informations and Communications Engineers, digest of Spring Conference 1994, pp. 4-240. Kobayashi et al. (no month available).

"Monolithically Integrated Laser With a Simple Laterally Tapered Waveguide", The Institute of Electronics Informations and Communications Engineers, digest of Autumn Conference 1993, pp. 4-261 Kasaya et al. (no month available).

"Tapered Thickness MQW Waveguide BH MQW Lasers", IEEE Photonics Technology Letters, vol. 6, No. 9, Sep., 1994, pp. 1080 to 1081 (1994) Kobayashi et al.

"InGaAsP/InP tapered active layer multiquantum well laser with 1.8dB coupling loss to cleaved singlemode fibre", Electronics Letters, 29th Sep. 1994, vol. 30, No. 20, pp. 1685 to 1687 Lealman et al.

*Primary Examiner*—Rodney B. Bovernick
*Assistant Examiner*—Luong-Quyen T. Phan
*Attorney, Agent, or Firm*—Sughrue, Mion, Zinn, Macpeak & Seas

[57] ABSTRACT

Disclosed is a tapered thickness waveguide integrated semiconductor laser which has an active layer in which light emits and recombines; and an output tapered waveguide which facilitates an optical coupling to an optical fiber; wherein the active layer and the output tapered waveguide are monolithically integrated on a common substrate, and the output waveguide has a buried structure and the width and thickness of the output waveguide are smaller than those of the active layer. The active layer may be placed between two cladding layers each of which has a different conductivity type with each other, and the output tapered waveguide has a portion which contacts undoped cladding layer.

6 Claims, 5 Drawing Sheets

- 4 MASK
- 3 IMPURITY DIFFUSION REGION
- 2 UNDOPED BUFFER LAYER
- 1 SUBSTRATE

- 14 ELECTRODE
- 13 CONTACT LAYER
- 12 HIGH-CONCENTRATION BURIED LAYER
- 11 LOW CONCENTRATION BURIED LAYER
- 10 CLADDING LAYER
- 8 TAPERED WAVEGUIDE
- 7 CLADDING LAYER

TAPERED THICKNESS WAVEGUIDE INTEGRATED SEMICONDUCTOR LASER

FIELD OF THE INVENTION

This invention relates to a tapered thickness waveguide integrated semiconductor laser, and more particularly to, a tapered thickness waveguide integrated semiconductor laser in which the coupling to a singlemode optical fiber is facilitated.

BACKGROUND OF THE INVENTION

An optical communication system for a subscriber in which an optical fiber is laid directly to a home or thereby and by which various information can be provided attracts attention. In constructing such subscriber system, reduction in the cost of various optical components which are employed in a communication apparatus is an important issue. In particular, with regard to a light source module, an optical coupling between a semiconductor laser and a singlemode optical fiber is a key to the reduction in the cost thereof. Therefore, various techniques in which the coupling with a singlemode optical fiber is facilitated by integrating a spot size transformer with a light source are suggested. For example, H. Kobayashi et al.,"Tapered Thickness MQW Waveguide BH MQW Lasers", IEEE Photonics Technology letters, Vol. 6, No. 9, pp. 1080–1081 (1994) (hereinafter referred to as "first prior art") discloses a narrow radiation tapered waveguide integrated semiconductor laser.

However, in the first prior art, the tapered waveguide is placed between a p-InP layer and a InP substrate, and particularly the absorption loss at the tapered waveguide region reaches a level not negligible. Furthermore, while the width of the waveguide is constant, a significant difference in thickness between a laser region and tapered waveguide region is required. Therefore, the tolerance in the fabrication of the device and yield in production are not sufficient.

As another example, K. Kasaya et al., "Monolithically Integrated Laser with A Simple Laterally Tapered Waveguide", The Institute of Electonics Informations and Communications Engineers, digest of Autumn Conference 1993, p. 4–261 (1993) (hereinafter referred to as "second prior art") discloses an integration type device.

However, in the second prior art, the reproducibility in fabrication of the device is not sufficient since the width of a guide layer is processed to about 0.45 μm by a standard etching after growing the planar guide layer etc. Further, to cover the guide layer with low concentration cladding layers, an undoped InP layer is to be grown only at a tapered waveguide region in the steps by the selective etching and selective re-growing. Therefore, the yield in production must be reduced since many growing steps are required.

SUMMARY OF THE INVENTION

Accordingly, it is an object of the invention to provide a tapered thickness waveguide integrated semiconductor laser in which the coupling to a singlemode optical fiber is facilitated and a yield in fabrication is enhanced.

According to the invention, a tapered thickness waveguide integrated semiconductor laser, comprises:

an active layer in which light emits and recombines; and an output tapered waveguide which facilitates an optical coupling to an optical fiber;

wherein the active layer and the output tapered waveguide are monolithically integrated on a common substrate, and the output waveguide has a buried structure and the width and thickness of the output waveguide are smaller than those of the active layer.

In an active layer, optical confinement factor should be set to a suitable value to obtain a sufficient gain. On the other hand, in a tapered optical waveguide, the size of the waveguide is reduced as much as possible to obtain a light spot size as large as possible. Therefore, both the width and thickness of the tapered waveguide are to be smaller than those of the active layer. Hereon, in the prior arts, since one of the width and thickness is varied to enlarge the spot size at the tapered waveguide, the difference therebetween is required to be quite big, thereby decreasing a tolerance in designing and making the fabrication more difficult.

In accordance with the invention, a high-performance device is provided by preparing an active layer with a width of a submicron by the selective growth technique, then forming a tapered waveguide with a width and thickness smaller than that of the active layer.

On the other hand, with regard to the cladding layers sandwiching a waveguide, the formation of a good p-n junction is required on the sides of an active layer and the cladding layer with lower doping concentration (preferably less than $5\times10^{17}$ cm$^{-3}$) and lower absorption is required on the side of a tapered waveguide.

In accordance with the invention, such good p-n junction can be easily formed in an active layer by the combination of the selective impurity diffusion technique and selective growth technique, and a cladding layer with a lower doping concentration and lower absorption can be easily obtained in a tapered waveguide.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a tapered thickness waveguide integrated semiconductor laser in the preferred embodiment, the aforementioned conventional device will be explained in FIGS. 1 to 2C.

Figure 1:
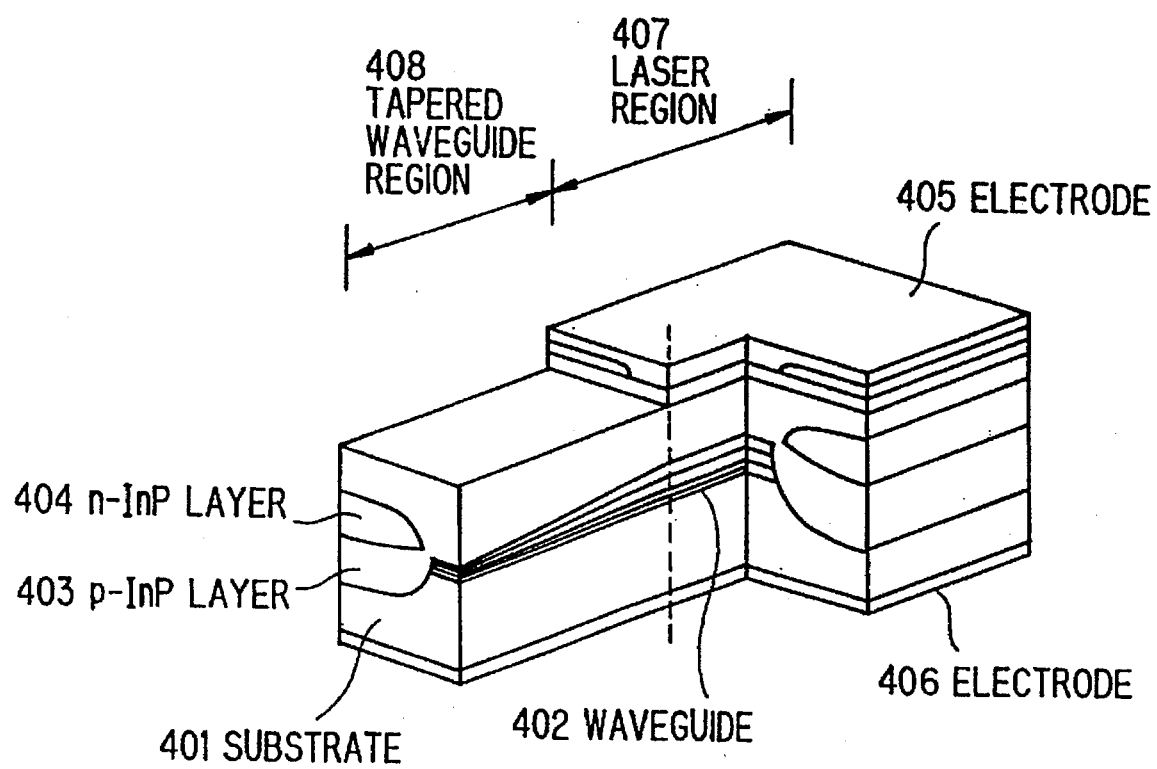
FIG. 1 is a schematic perspective view showing a conventional tapered waveguide integrated semiconductor laser.

As shown in FIG. 1, the device in the first prior art is characterized in that the thickness of a buried waveguide 402 is gradually varied by using the selective MOVPE technique. The thickness of the waveguide at a tapered waveguide region 408 is reduced to one fifth of that of the waveguide at a laser region 407, expanding the spot size nearby a light output facet to about 3 μm, thereby obtaining a coupling tolerance of ±2 μm @ 1 dB.

The tapered waveguide 402 is placed between a p-InP layer 403 and a InP substrate, and particularly the absorption loss at the tapered waveguide region reaches a level not negligible. Actually, the coupling efficiency is not so reduced as about 3 dB. Since the width of the waveguide is constantly 1.5 μm, the significant difference in thickness, i.e., 5:1 at the laser region 407 and the tapered waveguide region 408, respectively, is required. Therefore, the tolerance in the fabrication of the device and yield in production are not sufficient.

Figure 2A:
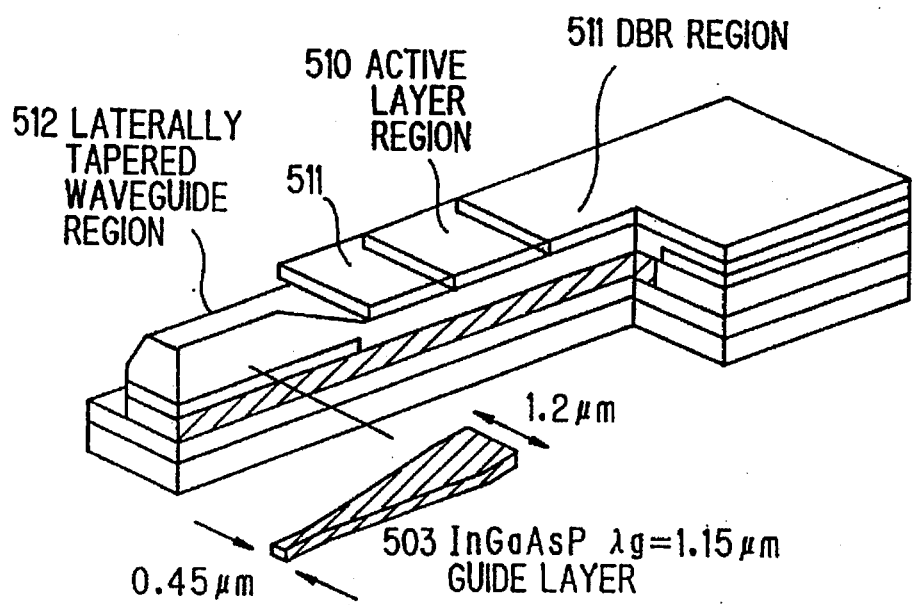
FIG. 2A is a schematic perspective view showing another conventional tapered waveguide integrated semiconductor laser.
Figure 2B:
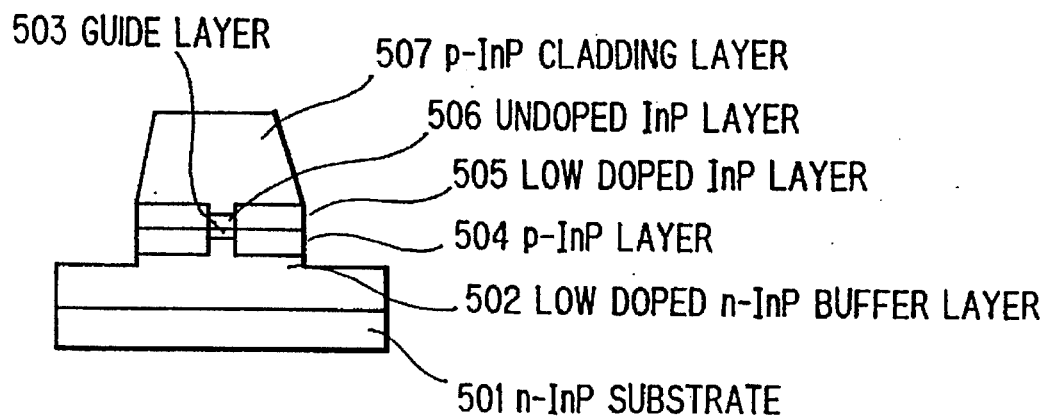
FIG. 2B is a cross sectional view vertically cut at a tapered waveguide region in FIG. 2A, and FIGS. 3A and 3B are perspective views explaining a method for making a tapered thickness waveguide integrated semiconductor laser in a preferred embodiment according to the invention.
Figure 3A:
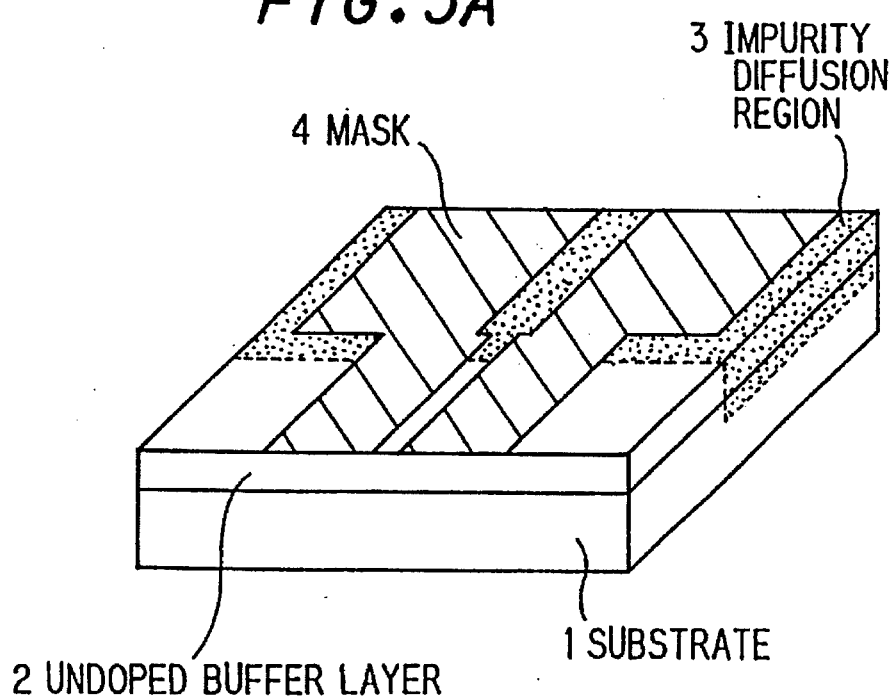
Figure 3B:
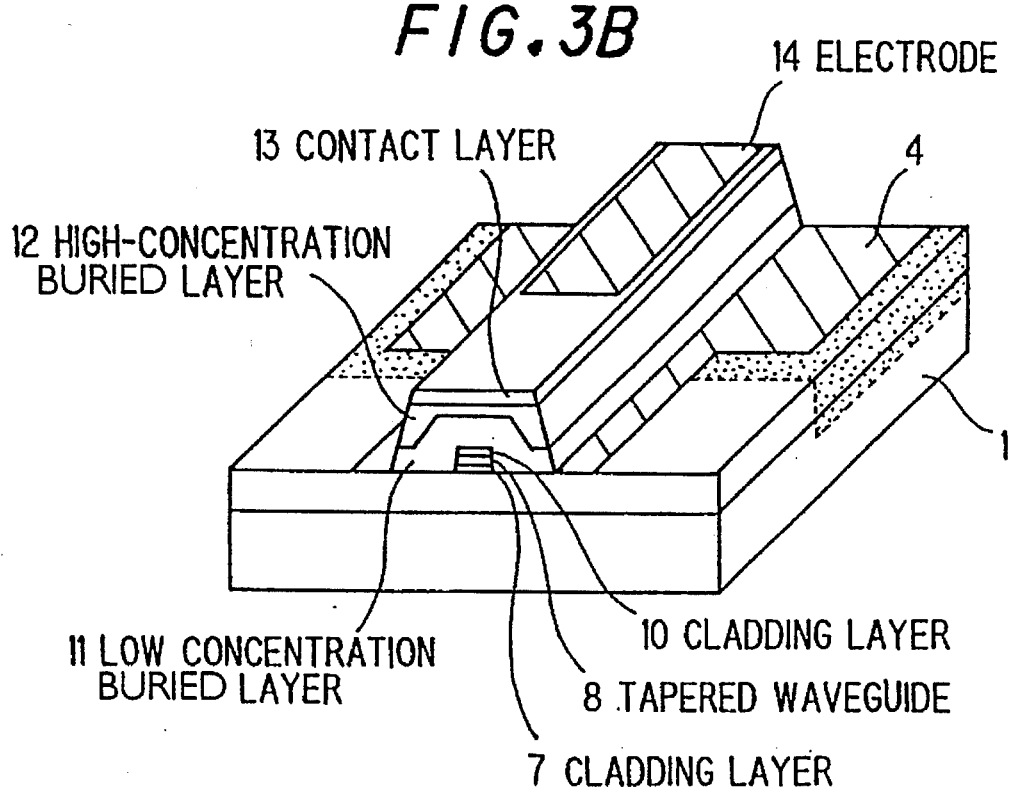

As shown in FIG. 2A, the device in the second prior art is characterized in that a InGaAsP guide layer 503 which is a tapered waveguide is formed on the output side of a DBR laser. The guide layer 503 has a structure that the width is gradually reduced from the laser to the radiation facet, thereby enlarging the light spot size to the direction of an output facet. In this example, to lower the absorption loss to an optical field where a spot size is enlarged, the guide layer 503 especially at a tapered waveguide region 512 is covered with a low doped or undoped layer. Namely, under the guide layer 503, the low doped n-InP buffer layer 502 is formed, and on the guide layer 503, the undoped InP layer 506 is formed.

The reproducibility in fabrication of the device is not sufficient since the width of the guide layer is processed to about 0.45 μm by a standard etching after growing the planar guide layer etc. Further, to cover the guide layer 503 with the low concentration cladding layers, the undoped InP layer 506 is grown only at the tapered waveguide region 512 in the steps by the selective etching and selective re-growing. Therefore, the yield in production must be reduced since many growing steps are required.

Next, a tapered thickness waveguide integrated semiconductor laser in a preferred embodiment according to the invention will be explained in FIGS. 3A to 5.

Figure 4A:
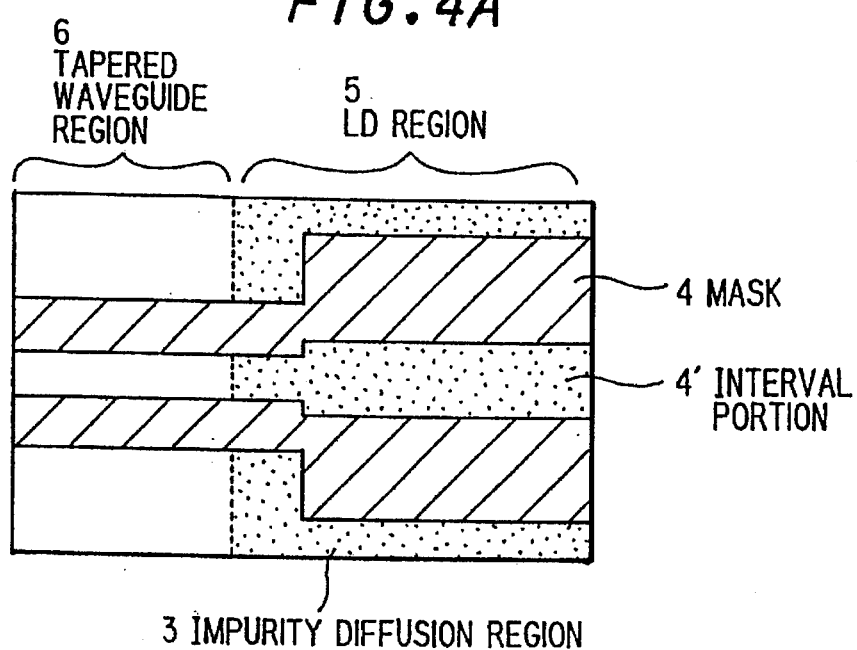
FIG. 4A is a plan view before a selective growth.
Figure 4B:
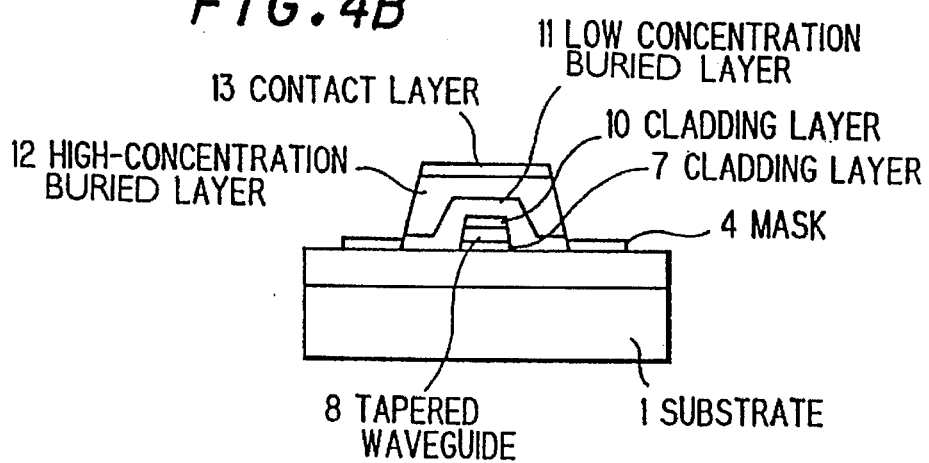
FIG. 4B is a cross sectional view at a tapered waveguide region.
Figure 4C:
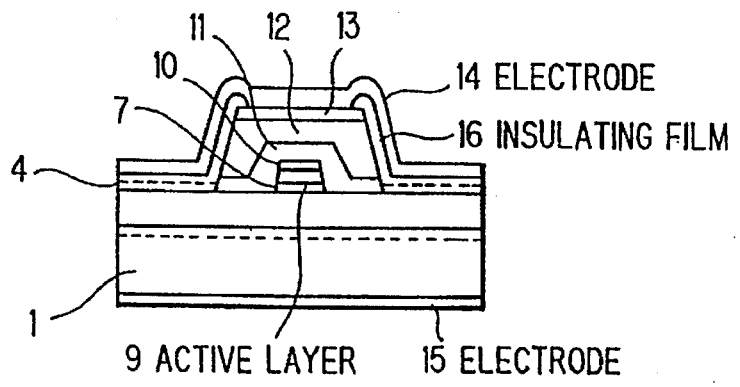
FIG. 4C is a cross sectional view at an active region after completing of a device.

A method for making a tapered thickness waveguide integrated semiconductor laser in the preferred embodiment will be explained in FIGS. 3A to 4C. Herein, FIGS. 4A, 4B and 4C show a plan view before a selective growth, a cross sectional view at a tapered waveguide region and cross sectional view at an active region after completing of a device, respectively.

Figure 5:
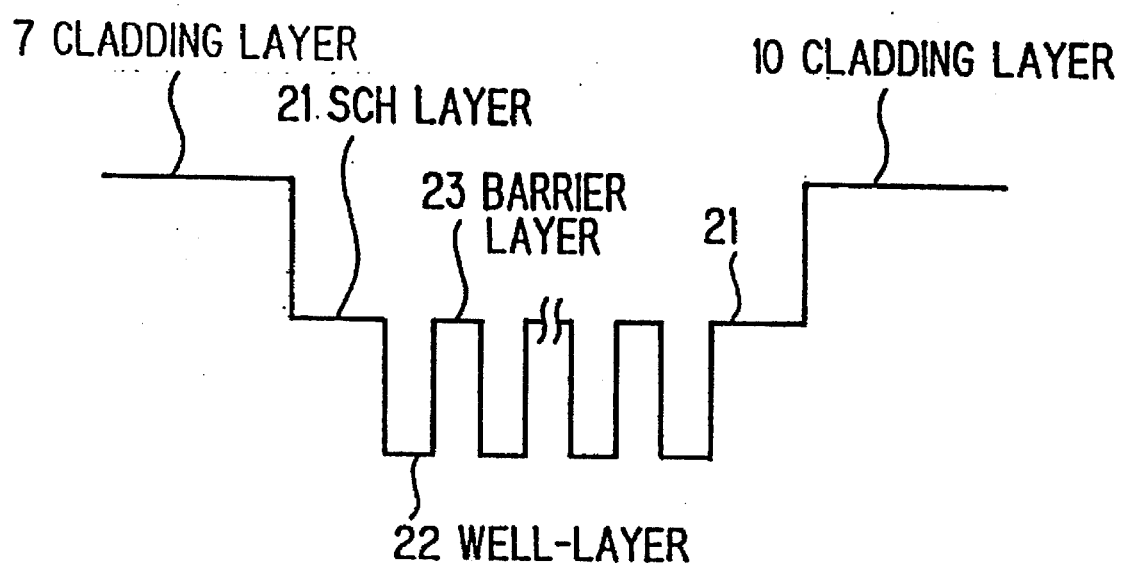
FIG. 5 is an explanatory diagram showing energy bands in an active layer.

First, an undoped InP buffer layer 2 with a thickness of 2 μm is grown on a p-InP substrate 1. Then, zinc is selectively diffused only into an LD region 5 to form an impurity diffusion region 3. This diffusion step is carried out by using the open-tube diffusion technique that dimethyl zinc(DMZ) and phosphine(PH3) are flown into a quartz reaction tube in which the substrate 1 is placed at a temperature of 600° C. for about 30 min. to diffuse it to the depth to penetrate the undoped buffer layer 2. The doping concentration after the diffusion is about $5 \times 10^{17}$ cm$^{-3}$. Then, SiO$_2$ insulating film is formed on the buffer layer 2 on the substrate 1, followed by patterning it in the form that widths of a mask 4 and an interval portion 4' are, as shown in FIG. 4A, different in the longitudinal direction. Thus, the widths of the mask 4 and interval portion 4' are varied at 50 μm from a diffusion edge of the impurity diffusion region 3, i.e., the widths of the mask 4 at a tapered region 6 and LD region 5 are 10 μm and 50 μm, respectively, and the widths of the interval portion at the tapered region 6 and LD region 5 are 0.5 μm and 0.8 μm, respectively. Then, over the substrate 1 formed such mask 4, an undoped InP cladding layer 7(with a thickness of 50 nm), a tapered waveguide layer 8, an active layer 9 and a n-InP cladding layer 10(with a thickness of 0.1 μm, doping concentration of $2 \times 10^{17}$ cm$^{-3}$) are in turn grown. Herein, the tapered waveguide layer 8 and active layer 9 may be continuously grown by the selective growth technique. The multilayer structure in the active layer 9, as shown in FIG. 5, consists of a unstrained InGaAsP SCH layer 21(with a thickness of 50 μm) with a PL(photoluminescence) wavelength composition of 1.1 μm, +1.0% compressively strained InGaAsP well layers 22(with a thickness of 7 nm) with a PL wavelength composition of 1.4 μm, unstrained InGaAsP barrier layer 23(with a thickness of 8 nm) with a PL wavelength composition of 1.1 μm and unstrained InGaAsP SCH layer 21(with a thickness of 50 nm) with a PL wavelength composition of 1.1 μm. The number of the well layers is eight. Thereafter, a part of the mask 4 where contacts a mesa stripe is removed to 5 μm at each sides thereof by etching, again growing a low-concentration n-InP buried layer 11(with a thickness of 3 μm at the top of the mesa and a doping concentration that is about linearly varied from 2 to $4 \times 10^{17}$ cm$^{-3}$ in the direction of lamination), high-concentration n-InP buried layer 12(with a thickness of 4 μm at the top of the mesa and a doping concentration of $5 \times 10^{17}$ cm$^{-3}$) and unstrained n-InGaAsP contact layer 13(with a thickness of 0.5 μm and a doping concentration of $1 \times 10^{19}$ cm$^{-3}$), then forming insulating film 16 and electrodes 14, 15 only on the LD region 5 to obtain the tapered thickness waveguide integrated semiconductor laser. A PL wavelength of the MQW structure forming the active layer 9 is 1.3 μm, and a PL wavelength of the MQW structure forming the tapered waveguide 8 is 1.2 μm. The thickness of the total MQW layers(including the SCH layers) is 212 nm, 96 nm at the active layer 9 and tapered waveguide 8, respectively. The width at the center of the MQW layers is 700 nm, 420 nm at the active layer 9 and tapered waveguide 8, respectively. A transition region of about 80 μm in the longitudinal direction is formed at the border where the width of the interval portion is varied. Thereby, an excessive absorption loss does not occur thereat since it is designed such that current can be flown into the transition region. Meanwhile, in FIGS. 3A to 4C, a growing layer outside the mask 4 is omitted.

The characteristics of the semiconductor laser fabricated as above are evaluated with the length of the laser region of 150 μm and the length of the tapered waveguide region of 160 μm, forming high reflections of 95%, 60% at side facets of the laser region and tapered region, respectively. As a result, the threshold current and slope efficiency at room temperature and 85° C. are 3 mA, 0.35 W/A and 6 mA, 0.25 W/A, respectively which are equal to the maximum value of a single laser. The radiation angles in the lateral and longitudinal direction are so small as 7.5° and 9.6°, respectively. Also, a coupling efficiency of a flat end face to a singlemode fiber(with a diameter of 10 μm) is 2 dB, and the range where a coupling loss is increased to 1 dB from the optimum value is 2.5 μm in the direction of upward, downward and lateral to realize a high tolerance.

Herein, the material of the substrate is not limited to InP, while this embodiment employs it as the material of the substrate. While a buried ridge structure by the selective growth technique is illustrated in this embodiment, a buried structure with a current block layer may be also employed.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A tapered thickness waveguide integrated semiconductor laser, comprising:

an active layer in which light emits and recombines; and an output tapered waveguide which facilitates an optical coupling to an optical fiber;

wherein said active layer and said output tapered waveguide are monolithically integrated on a common substrate, and said output waveguide has a buried structure and the width and thickness of said output waveguide are smaller than those of said active layer.

2. The semiconductor laser as defined in claim 1, wherein:

said active layer is sandwiched between two cladding layers of opposite conductivity types, and said output tapered waveguide is in contact partially with undoped cladding layer.

3. The semiconductor laser as defined in claim 1, wherein:

said active layer is coupled via a transition region to said output waveguide.

4. The semiconductor laser as defined in claim 1, wherein:

said buried structure is a buried ridge structure.

5. The semiconductor laser as defined in claim 1, wherein:

said buried structure has a current blocking layer.

6. The semiconductor laser as defined in claim 1, wherein:

said thickness of said active layer is more than twice that of said output waveguide; and said width of said active layer is less than twice that of said output waveguide.

* * * * *